US012648343B2

(12) United States Patent
Tian et al.

(10) Patent No.: US 12,648,343 B2
(45) Date of Patent: Jun. 2, 2026

(54) DISPLAY PANEL HAVING LIGHT-SHIELDING LAYER AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Xuewei Tian, Beijing (CN); Chunyan Xie, Beijing (CN); Dan Guo, Beijing (CN); Fei Fang, Beijing (CN); Hui Lu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/029,364

(22) PCT Filed: Mar. 28, 2022

(86) PCT No.: PCT/CN2022/083459
§ 371 (c)(1),
(2) Date: Mar. 29, 2023

(87) PCT Pub. No.: WO2023/184102
PCT Pub. Date: Oct. 5, 2023

(65) Prior Publication Data
US 2025/0024743 A1 Jan. 16, 2025

(51) Int. Cl.
*H10K 59/80* (2023.01)
*H10K 59/12* (2023.01)
(Continued)

(52) U.S. Cl.
CPC ..... *H10K 59/8792* (2023.02); *H10K 59/1201* (2023.02); *H10K 59/131* (2023.02); *H10K 59/65* (2023.02); *H10K 59/873* (2023.02)

(58) Field of Classification Search
CPC ............. H10K 59/8792; H10K 59/131; H10K 59/1201
(Continued)

(56) References Cited

U.S. PATENT DOCUMENTS

2020/0285123 A1* 9/2020 Kim .................. G02F 1/133512

FOREIGN PATENT DOCUMENTS

CN 110112101 A 8/2019
CN 111049955 A 4/2020
(Continued)

*Primary Examiner* — Xia L Cross
(74) *Attorney, Agent, or Firm* — IPro, PLLC

(57) ABSTRACT

Provided is a display panel. The display panel includes: a cutout region, a display region disposed on a periphery of the cutout region, and a winding region disposed between the cutout region and the display region. The display panel further includes: a substrate; a plurality of light-emitting devices disposed on the substrate, and a package layer and a light-shielding layer that are successively stacked and disposed on a side, distal from the substrate, of the plurality of light-emitting devices. The plurality of light-emitting devices are within the display region. The package layer is closer to the substrate relative to the light-shielding layer, and at least a portion of the light-shielding layer is within the winding region.

19 Claims, 5 Drawing Sheets

(51) Int. Cl.
H10K 59/131        (2023.01)
H10K 59/65        (2023.01)

(58) Field of Classification Search
USPC ........................................................ 257/40
See application file for complete search history.

(56)                    References Cited

FOREIGN PATENT DOCUMENTS

| | | | |
|---|---|---|---|
| CN | 111258456 | A | 6/2020 |
| CN | 111263060 | A | 6/2020 |
| CN | 111653595 | A | 9/2020 |
| CN | 111668265 | A | 9/2020 |
| CN | 112885243 | A | 6/2021 |
| WO | 2021167373 | A1 | 8/2021 |

* cited by examiner

00

0a     0b

0c

00

0b

00c

0a

10

A-A'

DISPLAY PANEL HAVING LIGHT-SHIELDING LAYER AND DISPLAY DEVICE

CROSS-REFERENCE TO RELATED APPLICATION

The present disclosure is a U.S. national stage of international application No. PCT/CN2022/083459, filed on Mar. 28, 2022, the content of which is herein incorporated by reference in its entirety.

TECHNICAL FIELD

The present disclosure relates to the technical field of displays, and in particular, relates to a display panel and a display device.

BACKGROUND OF THE INVENTION

At present, for a better visual experience of users, display screens (also referred to as display panels) in display devices are developing towards large screens and full screens.

SUMMARY OF THE INVENTION

Embodiments of the present disclosure provide a display panel and a display device.

According to one aspect of the embodiments of the present disclosure, a display panel is provided. The display panel includes a cutout region, a display region disposed on a periphery of the cutout region, and a winding region disposed between the cutout region and the display region; and the display panel includes:

a substrate;

a plurality of light-emitting devices disposed on the substrate, wherein the plurality of light-emitting devices are within the display region; and a package layer and a light-shielding layer that are successively stacked and disposed on a side, distal from the substrate, of the plurality of light-emitting devices, wherein the package layer is closer to the substrate relative to the light-shielding layer, and at least a portion of the light-shielding layer is within the winding region.

In some embodiments, the light-shielding layer includes a first light-shielding portion within the winding region, wherein an outer boundary of an orthographic projection of the first light-shielding portion on the substrate is consistent with an outer boundary of an orthographic projection of the winding region on the substrate.

In some embodiments, the light-shielding layer further includes a second light-shielding portion connected to the first light-shielding portion, wherein the second light-shielding portion is within the display region, an orthographic projection of the second light-shielding portion on the substrate being not at least partially overlapped with an orthographic projection of the light-emitting device on the substrate.

In some embodiments, the second light-shielding portion includes a plurality of via holes, wherein the plurality of via holes are in one-to-one correspondence to a portion of the plurality of light-emitting devices, an orthographic projection of one of the via holes on the substrate being at least partially overlapped with an orthographic projection of the corresponding light-emitting device on the substrate.

In some embodiments, an outer boundary of the orthographic projection of one of the via holes on the substrate is at least partially overlapped with an outer boundary of the orthographic projection of the corresponding light-emitting device on the substrate.

In some embodiments, an orthographic projection of the light-shielding layer on the substrate is annular-shaped, and an inner boundary of the orthographic projection of the light-shielding layer on the substrate is consistent with an outer boundary of an orthographic projection of the cutout region on the substrate.

In some embodiments, a width of the orthographic projection of the light-shielding layer on the substrate is greater than or equal to 200 µm.

In some embodiments, the package layer includes an organic package layer, wherein an orthographic projection of the organic package layer on the substrate is staggered from the orthographic projection of the winding region on the substrate; and the display panel further includes: a first planarization layer disposed between the package layer and the light-shielding layer, wherein the first planarization layer covers a region where the organic package layer is staggered from the winding region.

In some embodiments, the first planarization layer is completely within the winding region.

In some embodiments, the display panel further includes: a first inorganic protection layer disposed between the first planarization layer and the light-shielding layer, wherein the first inorganic protection layer includes a first opening, the first opening being within the winding region, and an outer boundary of an orthographic projection of the first opening on the substrate being not overlapped with an outer boundary of an orthographic projection of the cutout region on the substrate.

In some embodiments, the substrate includes: a base substrate and a plurality of pixel drive circuits disposed on the base substrate and electrically connected to the plurality of light-emitting devices in one-to-one correspondence;

and the substrate further includes first signal lines connected to the pixel drive circuits disposed in a same column and second signal lines electrically connected to the pixel drive circuits disposed in a same row; wherein a portion of the first signal lines include first windings, and a portion of the second signal lines include second windings, the first winding and the second winding being disposed within the winding region.

In some embodiments, the light-emitting device includes: an anode layer, a light-emitting layer, and a cathode layer that are successively stacked along a direction perpendicular to and away from the substrate, wherein the anode layer is electrically connected to the pixel driver circuit; and the substrate further includes: a second planarization layer and a second inorganic protection layer that are disposed on a side, distal from the base substrate, of the plurality of pixel drive circuits, wherein the second planarization layer is closer to the base substrate relative to the second inorganic protection layer;

wherein the second inorganic protection layer includes a second opening, and the second planarization layer includes a first groove structure communicated with the second opening, the first groove structure being configured to separate a portion, within the display region, of the cathode layer from a portion, within the winding region, of the cathode layer.

In some embodiments, the second planarization layer further includes a second groove structure and a third groove structure, wherein the second groove structure is closer to the display region relative to the first groove structure, and the first groove structure is closer to the display region relative to the third groove structure, the second inorganic protection layer covering side faces of the second groove structure and the third groove structure.

According to another aspect of the embodiments of the present disclosure, a method for manufacturing a display panel is provided. The display panel includes a cutout region, a display region disposed on a periphery of the cutout region, and a winding region disposed between the cutout region and the display region, and the method includes:

forming a plurality of light-emitting devices on a substrate, wherein the plurality of light-emitting devices are within the display region; and forming a package layer and a light-shielding layer, which are successively stacked, on the plurality of light-emitting devices, wherein the package later is closer to the substrate relative to the light-shielding layer, and the light-shielding layer includes a first light-shielding portion within the winding region.

According to still another aspect of the embodiments of the present disclosure, a display device is provided. The display device includes: a photosensitive device and the display panel as described above, wherein the photosensitive device is disposed on a side opposite to a display surface of the display panel, an orthographic projection of a light-receiving surface of the photosensitive device on a substrate being within a cutout region.

BRIEF DESCRIPTION OF DRAWINGS

For clearer descriptions of the technical solutions in the embodiments of the present disclosure, the accompanying drawings to be required in the descriptions of the embodiments are briefly introduced hereinafter. Apparently, the accompanying drawings in the following description show merely some embodiments of the present disclosure, and persons of ordinary skills in the art may still derive other drawings from these accompanying drawings without creative efforts.

DETAILED DESCRIPTION

The full-screen display device increases a size of the display screen without increasing the overall size of the display device due to its high screen-to-body ratio (generally up to 80% or even more than 90%).

Typically, various photosensitive devices such as cameras, infrared sensors, light sensors, and the like sensors need to be placed against a front side of the full-screen display device needs. For a greater screen-to-body ratio of the full-screen display device, an opening is evacuated inside the display panel of the full-screen display device, then the photosensitive devices are placed against a back side of the display panel, and light-receiving surfaces of the photosensitive devices are made close to the opening. In this case, ambient light passes through the opening of the display panel and enters light entrance surfaces of the photosensitive devices, such that the photosensitive devices function normally.

However, in the above display panel, the light emitted by a portion, proximal to the opening, of the display panel is prone to exit through the opening of the display panel, such that light leakage occurs at the opening of the display panel, and thus a photosensitive effect of the photosensitive device is affected.

The present disclosure is described in further detail with reference to the accompanying drawings, to clearly present the objects, technical solutions, and advantages of the present disclosure.

Figures 1, 2:
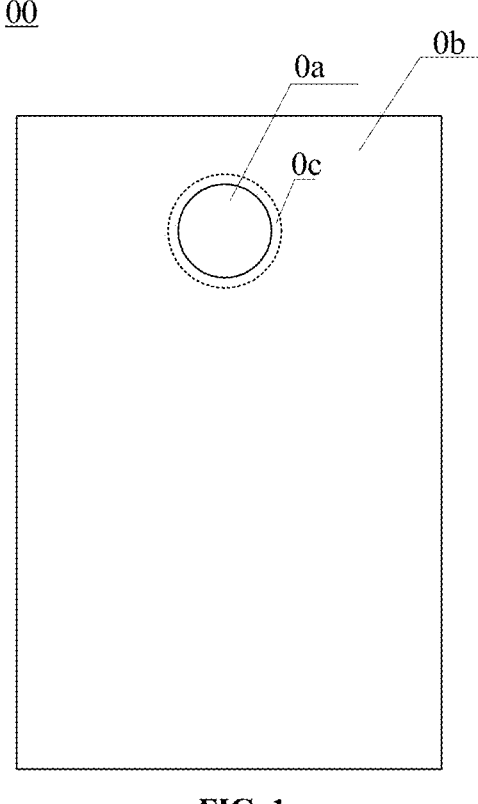
FIG. 1 is a top view of a common display panel.
FIG. 2 is a partially enlarged diagram of the display panel illustrated in FIG. 1.

FIG. 1 is a top view of a common display panel, and FIG. 2 is a partially enlarged diagram of the display panel illustrated in FIG. 1. Referring to FIG. 1, the display panel 00 includes: a cutout region 0a and a display region 0b disposed on a periphery of the cutout region 0a. The display panel 00 includes: a substrate and a plurality of light-emitting devices 10 disposed on the substrate. The plurality of light-emitting devices 10 are within the display region 0b. Various photosensitive devices such as cameras, infrared sensors, and light sensors are disposed on a back side of the display panel 00, and light-receiving surfaces of the photosensitive devices are close to the cutout region 0a. In this case, ambient light is capable of entering light entrance surfaces of the photosensitive devices upon passing through the cutout region 0a of the display panel 00, such that the photosensitive devices function normally.

For a greater transmittance of the cutout region 0a in the display panel 00, it is necessary to ensure that the cutout region 0a in the display panel 00 is not provided with any structure. Therefore, the signal wiring, in the display panel 00, of which the extension direction is intersected with the cutout region 0a requires to be provided with a winding portion, and the winding portion is disposed between the cutout region 0a and the display region 0b, such that the signal wiring is electrically connected to the light-emitting devices 10 disposed on both sides of the cutout region 0a upon bypassing the cutout region 0a. Accordingly, a winding region 0c for disposing the winding portion of the signal wiring is defined between the display region 0b and the cutout region 0a in the display panel 00.

However, the light emitted by the light-emitting device 10 has a large range of exit angles, that is, a maximum angle between the light emitted by the light-emitting device 10 and a normal of the display panel is large, and the winding region 0c is defined between the plurality of light-emitting devices 10 within the display region 0b and the cutout region 0a. Therefore, the light emitted by the light-emitting device 10 arranged in the display region 0b near the cutout region 0a is prone to pass through the winding region 0c and be emitted to the cutout region 0a, resulting in light leakage in the cutout region 0a of the display panel 00. Moreover, the normal photosensitivities of the photosensitive devices disposed on the back side of the display panel 00 are inevitably affected by the light emitted to cutout region 0*a* upon passing through the winding region 0*c*, such that the photosensitive effects of the photosensitive devices are poor.

Figure 3:
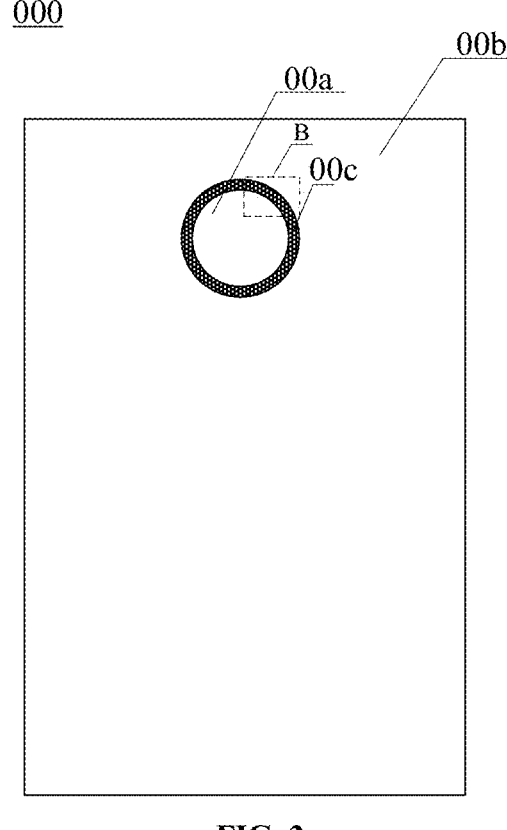
FIG. 3 is a top view of a display panel according to some embodiments of the present disclosure.

FIG. 3 is a top view of a display panel according to some embodiments of the present disclosure. Referring to FIG. 3, the display panel 000 includes a cutout region 00*a*, a display region 00*b* disposed on a periphery of the cutout region 00*a*, and a winding region 00*c* disposed between the cutout region 00*a* and the display region 00*b*. The display panel 000 herein is an organic light-emitting display (OLED) display panel or an active matrix/organic light-emitting diode (AM-OLED) display panel. In the case that the display panel 000 is the OLED display panel 000 or the AM-OLED display panel, the display panel 000 is a top-emitting type display panel or a bottom-emitting type display panel.

Figure 4:
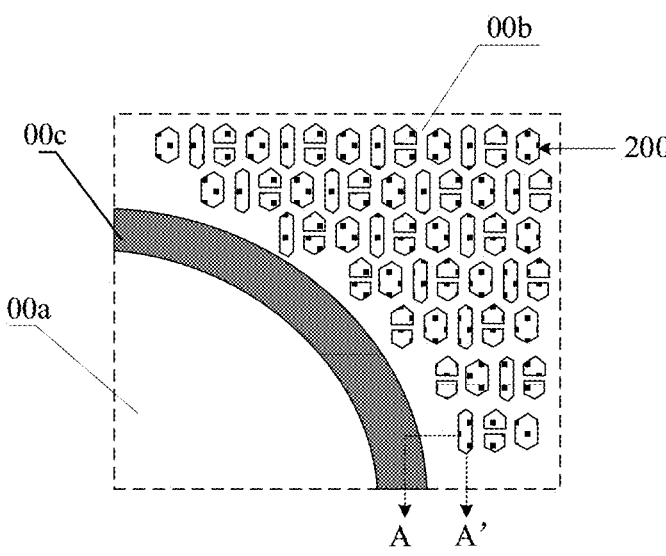
FIG. 4 is a partially enlarged diagram of the display panel illustrated in FIG. 3 at a portion B.
Figure 5:
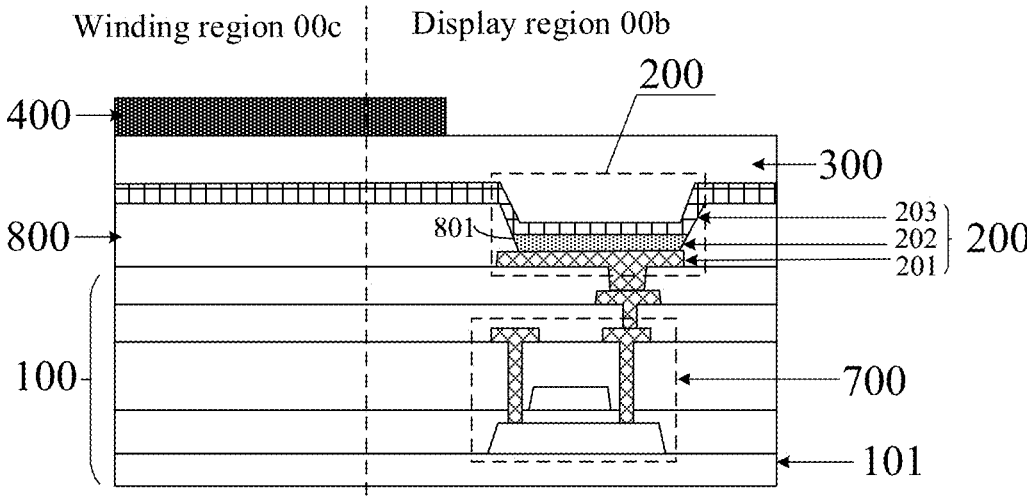
FIG. 5 is a film-layer schematic diagram of the display panel illustrated in FIG. 4 at a line A-A'.

FIG. 4 is a partially enlarged diagram of the display panel illustrated in FIG. 3 at a portion B, and FIG. 5 is a film-layer schematic diagram of the display panel illustrated in FIG. 4 at a line A-A'. The structure of the display panel 000 is clearly illustrated with reference to FIG. 4. As illustrated in FIG. 4, the display panel 000 includes: a substrate 100, a light-emitting device 200, a package layer 300, and a light-shielding layer 400.

The number of light-emitting devices 200 in the display panel 000 is plural. The plurality of light-emitting devices 200 are disposed on the substrate 100 and are arranged in arrays within the display region 00*b*. It should be noted that light emitted by each of the light-emitting devices 200 includes light emitted in a vertical direction and light emitted at a large angle. The light emitted at a large angle by the light-emitting device 200 indicates that an included angle between the light and a normal of the display panel 000 is large.

The package layer 300 and the light-shielding layer 400 of the display panel 000 are stacked, and the package layer 300 and the light-shielding layer 400 are both arranged on a side, distal from the substrate 100, of the plurality of light-emitting devices 200. The package layer 300 is closer to the substrate 100 relative to the light-shielding layer 400, and at least a portion of the light-shielding layer 400 is within the winding region 00*c*.

In some embodiments of the present disclosure, the light emitted at a large angle by the light-emitting device 200 disposed in the display region 00*b* close to the cutout region 00*a* requires to pass through the package layer 300 within the winding region 00*c* between the display region 00*b* and the cutout region 00*a* prior to being emitted to the cutout region 00*a*. Therefore, in the case that the light-shielding layer 400 is disposed on a side, distal from the substrate 100, of the package layer 300 and the at least a portion of the light-shielding layer 400 is ensured to be within the winding region 00*c*, the light emitted at a large angle by the light-emitting device 200 is ensured to be shielded by the light-shielding layer 400 prior to being emitted to the cutout region 00*a*, such that the probability that light leakage occurs in the cutout region 00*a* of the display panel 000 is reduced.

In summary, the display panel according to some embodiments of the present disclosure includes: the substrate, the plurality of light-emitting devices, the package layer, and the light-shielding layer. The light emitted at a large angle by the light-emitting device within the display region close to the cutout region requires to pass through the package layer within the winding region between the display region and the cutout region prior to being emitted to the cutout region. Therefore, in the case that the light-shielding layer is disposed on the side, distal from the substrate, of the package layer and at least a portion of the light-shielding layer is ensured to be within the winding region, the light emitted at a large angle by the light-emitting device is shielded by the light-shielding layer prior to being emitted to the cutout region, such that the probability that light leakage occurs in the cutout region of the display panel is reduced. In this way, in a display device with this display panel, a photosensitive device disposed on a back side of the display panel is capable of sensing light normally, such that the photosensitive effect of the photosensitive device is improved.

Figure 6:
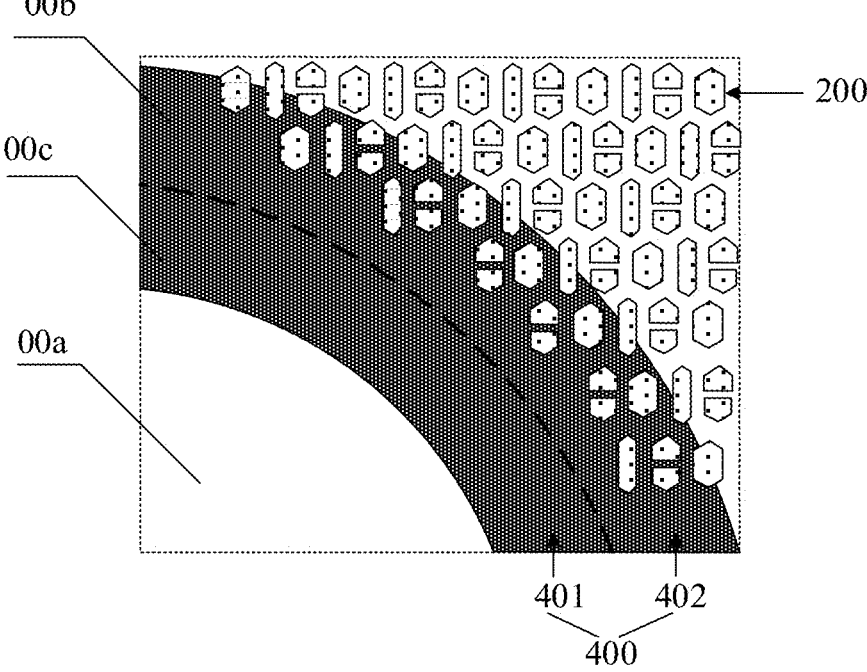
FIG. 6 is another partially enlarged diagram of the display panel illustrated in FIG. 3 at a portion B.

FIG. 6 is another partially enlarged diagram of the display panel illustrated in FIG. 3 at a portion B. Referring to FIG. 6, in some embodiments of the present disclosure, the light-shielding layer 400 includes a first light-shielding portion 401 within the winding region, and an outer boundary of an orthographic projection of the first light-shielding portion 401 on the substrate 100 is consistent with an outer boundary of an orthographic projection of the winding region 00*c* on the substrate 100. In this way, the light-shielding layer 400 covers a portion, within the winding region 00*c*, of the package layer 300, such that a portion of the light emitted at a large angle by the light-emitting device 200 that passes through the winding region 00*c* is completely shielded by the package layer 400, and thus the probability that light leakage occurs in the cutout region 00*a* of the display panel 000 is further reduced.

Optionally, referring to FIG. 6, the light-shielding layer 400 further includes a second light-shielding portion 401 connected to the first light-shielding portion 401. The second light-shielding portion 402 is within the display region 00*b*. That is, the light-shielding layer 400 extends towards display region 00*b*. In this way, the light-shielding layer 400 is capable of covering the portion, within the winding region 00*c*, of the package layer 300 and a portion, within the display region 00*b*, of the package layer 300, such that the light emitted to the cutout region 00*a* in the light emitted by the light-emitting device 200 is further reduced, and thus the probability that light leakage occurs in the cutout region 00*a* of the display panel 000 is further reduced.

In some embodiments of the present disclosure, for preventing the second light-shielding portion 402 in the light-shielding layer 400 from affecting the normal display of the display region 00*b*, it is necessary to ensure that an orthographic projection of the second light-shielding portion 402 on the substrate 100 is not at least partially overlapped with an orthographic projection of the light-emitting device 200 on the substrate 100. In this way, a portion of the light emitted by a portion of the light-emitting devices 200 within the display region 00*b* exits from the display panel 000 upon passing through the second light-shielding portion 402, such that the display region 00*b* of the display panel 000 displays pictures normally.

Exemplarily, the light emitted by the light-emitting device 200 in the vertical direction exits by normally passing through the second light-shielding portion 402, and the light emitted by the light-emitting device 200 at a large angle is shielded by the second light-shielding portion 402. Therefore, the second light-shielding portion 402 prevents the light emitted by the light-emitting device 200 from entering the cutout region 00*a* without affecting the normal display of the display region 00*b*.

Figure 7:
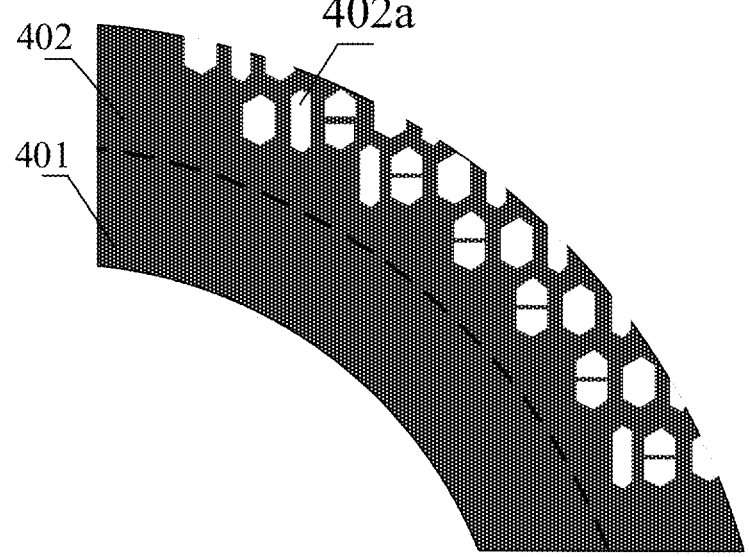
FIG. 7 is a schematic diagram of a partial structure of a light-shielding layer according to some embodiments of the present disclosure.

FIG. 7 is a schematic diagram of a partial structure of a light-shielding layer according to some embodiments of the present disclosure. Referring to FIG. 7, in some embodiments, the second light-shielding portion 402 includes a plurality of via holes 402*a*, and the plurality of via holes 402*a* are in one-to-one correspondence to a portion of the plurality of light-emitting devices 200. An orthographic projection of one of the via holes 402*a* on the substrate 100 is at least partially overlapped with an orthographic projection of the corresponding light-emitting device 200 on the substrate 100. For example, a portion of light-emitting devices 200, arranged close to the cutout region 00*a*, in the plurality of light-emitting devices 200 are in one-to-one correspondence to the plurality of via holes 402*a*, such that the light emitted in the vertical direction by each of the light-emitting devices 200 arranged close to the cutout region 00*a* exits upon passing through the corresponding via hole 402.

Referring to FIG. 7, it should be noted that the display region 00*b* is not completely covered by the second light-shielding portion 402. In this way, an outer boundary of an orthographic projection of one of the via holes 402*a* arranged at an edge of the second light-shielding portion 402 on the substrate 100 is partially overlapped with the outer boundary of the orthographic projection of the corresponding light-emitting device 200 on the substrate 100; and an outer boundary of an orthographic projection of the via hole 402*a* arranged in other regions of the second light-shielding portion 402 on the substrate 100 is completely overlapped with the outer boundary of the orthographic projection of the corresponding light-emitting device 200 on the substrate 100.

For improvement of the light-shielding effect of the via hole 402*a*, an area of the orthographic projection of the via hole 402*a* on the substrate 100 is less than an area of the orthographic projection of the corresponding light-emitting device 200 on the substrate 100. That is, the second light-shielding portion 402 covers a portion of light-emitting regions of the light-emitting devices 200. In this way, the light emitted by the light-emitting device 200 at a large angle and a portion of the light emitted in the vertical direction are both shielded by the second light-shielding portion 402, such that the light emitted by the light-emitting device 200 is further prevented from entering the cutout region 00*a*, and thus light leakage does not occur in the cutout region 00*a* of the display panel 000.

In some embodiments of the present disclosure, the winding region 00*c* between the cutout region 00*a* and the display region 00*b* of the display panel 00 is annular. In the case that the second light-shielding portion 402 of the light-shielding layer 400 is only overlapped with a portion of the display region 00*b*, an orthographic projection of the light-shielding layer 400 on the substrate 100 is annular-shaped. Moreover, an inner boundary of the orthographic projection of the light-shielding layer 400 on the substrate 100 is consistent with an outer boundary of an orthographic projection of the cutout region 00*a* on the substrate 100, such that the winding region 00*c* is ensured to be completely covered by the light-shielding layer 400.

Optionally, a width of the orthographic projection of the light-shielding layer 400 on the substrate 100 is greater than or equal to 200 μm, such that light leakage does not occur in the cutout region 00*a* of the display panel 000.

Figure 8:
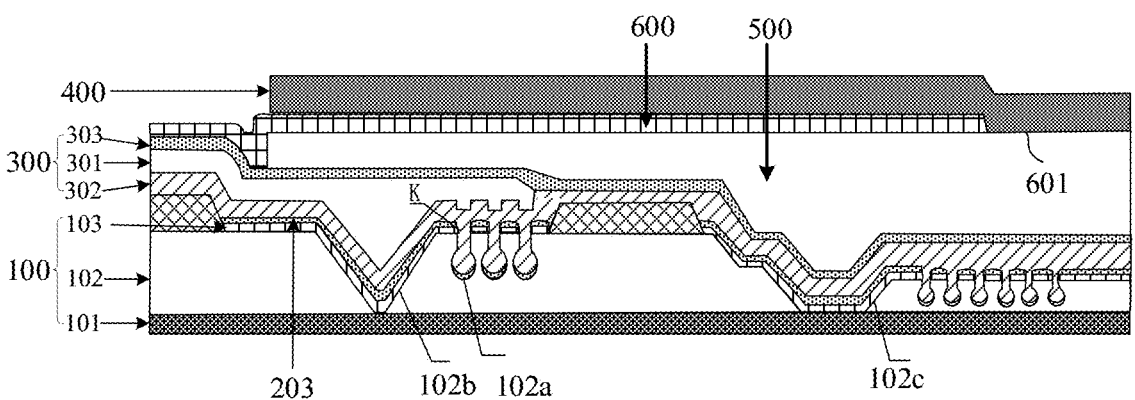
FIG. 8 is a schematic diagram of a film-layer structure of a winding region of a display panel according to some embodiments of the present disclosure.

FIG. 8 is a schematic diagram of a film-layer structure of a winding region of a display panel according to some embodiments of the present disclosure. Referring to FIG. 8, in some embodiments of the present disclosure, the package layer 300 of the display panel 000 includes: an organic package layer 301. Exemplarily, the package layer 300 further includes: a first inorganic package layer 302 disposed on a side, proximal to the substrate 100, of the organic package layer 301, and a second inorganic package layer

303 disposed on a side, distal from the substrate 100, of the organic package layer 301. The package layer 300 is configured to package the light-emitting device 200 in the display panel 000, isolate the light-emitting device 200 from outside air, and avoid a light-emitting layer of the light-emitting device 200 from being eroded by the moisture, oxygen, and other elements in the air. The first inorganic package layer 302 and the second inorganic package layer 303 are configured to isolate the moisture and oxygen in the air, the organic package layer 301 is configured to absorb the stress of the first inorganic package layer 302 and the second inorganic package layer 303, and the organic encapsulation layer 301 is further configured to wrap and cover micro foreign matters on the first inorganic package layer 302. The organic package layer 301 is formed by inkjet printing using a liquid organic material.

The cutout region 00*a* in the display panel 000 is generally not provided with any structure, and therefore, after the display panel 000 is manufactured, a portion of the display panel 000 that is within the cutout region 00*a* requires to be cut along an outer boundary of the cutout region 00*a*. During the cutting process, elements such as moisture and oxygen in the air are prone to enter from a side of the organic package layer 301. For prevention of erosion of the light-emitting layer of the light-emitting device 200 by the moisture and oxygen entering inside from the side of the organic package layer 301, it is necessary to ensure that the second inorganic package layer 303 is capable of covering the side of the organic package layer 301, such that the second inorganic package layer 303 prevents entrance of the moisture and oxygen from the side of the organic package layer 301.

Therefore, an orthographic projection of the inorganic package layer 301 on the substrate 100 is staggered from an orthographic projection of the winding region 00*c* on the substrate 100. That is, the organic package layer 301 only partially covers the winding region 00*c* and does not cover all of the winding region 00*c*.

In this way, a flatness of a film layer structure within the winding region 00*c* of the display panel 000 is low. For better flatness of the film layer structure within the winding region 00*c* of the display panel 000, the display panel 000 further includes: a first planarization layer 500 disposed between the package layer 300 and the light-shielding layer 400. The first planarization layer 500 covers a region where the organic package layer 301 is staggered from the winding region 00*c*. In this case, the flatness of the film layer structure within the winding region 00*c* of the display panel 000 is improved by the first planarization layer 500, such that a flatness of the light-shielding layer 400 in the display panel 000 is great, and thus the light-shielding effect of light-shielding layer 400 is improved.

Exemplarily, referring to FIG. 8, the organic package layer 301 in the package layer 300 completely covers the display region 00*b* and only covers a portion of the winding region 00*c*. Therefore, the first planarization layer 500 in the display panel 000 is completely within the winding region 00*c*, and a flatness of a light-exit side of the display panel 000 is high without disposing the first planarization layer 500 within the display region 00*b*.

Optionally, referring to FIG. 8, the display panel 000 further includes: a first inorganic protection layer 600 disposed between the first planarization layer 500 and the light-shielding layer 400. The first inorganic protection layer 600 includes a first opening 601. The first opening 601 of the first inorganic protection layer 600 is within the winding region 00*c*, and an outer boundary of an orthographic projection of the first opening 601 on the substrate 100 is not overlapped with the outer boundary of the orthographic projection of the cutout region 00a on the substrate 100. The first planarization layer 500 in the display panel 000 is protected by the first inorganic protection layer 600, and an edge of the first planarization layer 500 is prevented from being abraded. Moreover, in the case that the outer boundary of the orthographic projection of the first opening 601 on the substrate 100 is not overlapped with the outer boundary of the orthographic projection of the cutout region 00a on the substrate 100, during the cutting process along the outer boundary of the cutout region 00a of the display panel 000, the first inorganic protection layer 600 is avoided from being cut, such that a probability of cracking occurrence during the cutting process is reduced.

In some embodiments of the present disclosure, as illustrated in FIG. 5, the substrate 100 of the display panel 000 includes: a base substrate 101, and a plurality of pixel drive circuits 700 disposed on the base substrate 101 and electrically connected to the plurality of light-emitting devices in one-to-one correspondence. Each of the pixel drive circuits 700 drives the corresponding light-emitting device 200 to emit light. The plurality of light-emitting devices 200 and the plurality of pixel drive circuits 700 of the display panel 000 are arranged in arrays.

Figure 9:
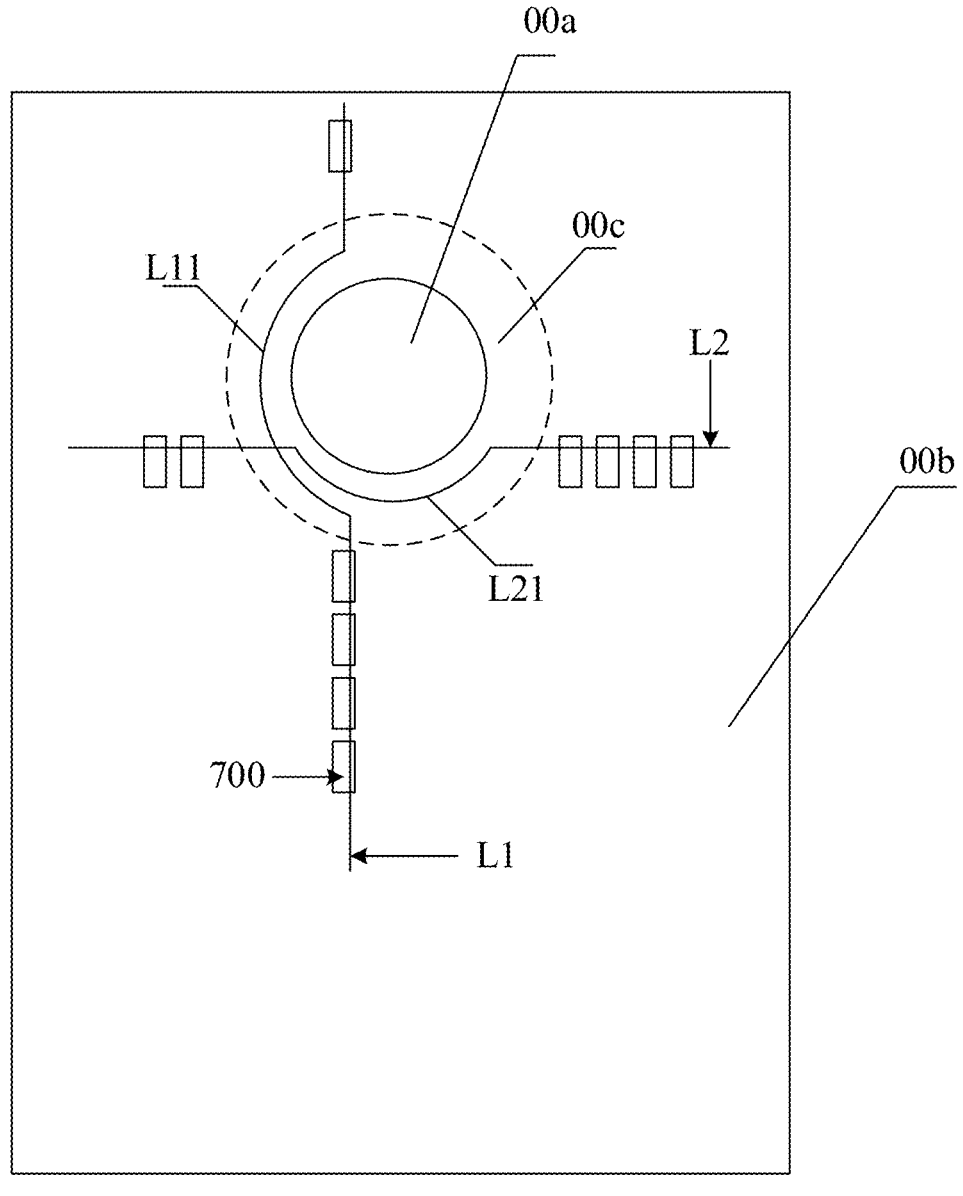
FIG. 9 is a schematic structural diagram of a first signal line and a second signal line according to some embodiments of the present disclosure.

FIG. 9 is a schematic structural diagram of a first signal line and a second signal line according to some embodiments of the present disclosure. Referring to FIG. 9, in some embodiments of the present disclosure, the substrate 100 in the display panel 000 is provided with first signal lines L1 electrically connected to pixel drive circuits 700 disposed in a same column, and second signal lines L2 electrically connected to pixel drive circuits 700 disposed in a same row. That is, the first signal lines L1 in the substrate 100 are signal lines arranged in a column direction, and the second signal lines L2 in the substrate 100 are signal lines arranged in a row direction.

A portion of the first signal lines L1 in the substrate 100 are provided with first windings L11 and a portion of the second signal lines L2 are provided with second windings L21. Both the first winding L11 and the second winding L12 herein are within the winding region 00c. By disposing the first windings L11 in the first signal lines L1 and the second windings L21 in the second signal lines L2 within the winding region 00c, the first signal lines L1 with the first windings L11 are ensured to be properly connected to a column of pixel driver circuits 700 disposed on two sides of the cutout region 00a, and the second signal lines L2 with the second windings L21 are ensured to be properly connected to a row of pixel driver circuits 700 disposed on the two sides of the cutout region 00a.

Exemplarily, in a plurality of columns of pixel drive circuits 700 arranged on the two sides of the cutout region 00a, and the plurality of first signal lines L1, a portion of the first signal lines L1 electrically connected to the pixel drive circuits 700 are provided with the first windings L11, and other first signal lines L1 are not provided with the first windings L11.

In a plurality of rows of pixel drive circuits 700 arranged on the two sides of the cutout region 00a, and the plurality of second signal lines L2, a portion of the second signal lines L2 electrically connected to the pixel drive circuits 700 are provided with the second windings L12, and other second signal lines L2 are not provided with the second windings L12.

Referring to FIG. 5, in some embodiments of the present disclosure, the light-emitting device 200 includes: an anode layer 201, a light-emitting layer 202, and a cathode layer 203 that are stacked and arranged along a direction perpendicular to and away from the substrate. The anode layer 201 in the light-emitting device 200 is electrically connected to the corresponding pixel drive circuit 700, and the cathode layer 203 in the display panel 000 is a transparent electrode layer disposed in a whole layer. For example, the display panel 000 further includes: a pixel definition layer 800 disposed on the substrate 100. The pixel definition layer 800 is configured to define a plurality of pixel regions 801 within the display region 00b. The plurality of pixel regions 801 correspond to the plurality of light-emitting devices 200 in one-to-one correspondence, and each of the pixel regions 801 is provided with the anode layer 201 of the corresponding light-emitting device 200, such that under a cooperative action of the anode layer 201 within each pixel region 801 and a portion of the cathode layer 203 that is within the each pixel region 801, a portion of the light-emitting layer 202 that is within the each pixel region 801 emits light.

Referring to FIG. 8, the substrate 100 further includes: a second planarization layer 102 and a second inorganic protection layer 103 that are disposed on a side, distal from the base substrate 101, of the plurality of pixel driver circuits 700. The second planarization layer 102 is closer to the base substrate 101 relative to the second inorganic protection layer 103. The second inorganic protection layer 103 is provided with a second opening K, and the second planarization layer 102 is provided with a first groove structure 102a communicated with the second opening K. The first groove structure 102a is configured to separate a portion, within the display region 00b, of the cathode layer 203 from a portion, within the winding region 00c, of the cathode layer 203. In this way, the portion, within the winding region 00c, of the cathode layer 203 is prevented from interfering the signal lines arranged in the winding region 00c. Optionally, the first groove structure 102a is an annular structure arranged along the winding region 00c, and the number of first groove structures 102a is plural, such that the cathode layer 203 is ensured to be separated. A side of the first groove structure 102a is a teardrop-shaped groove structure or an inverted trapezoidal groove structure. Exemplarily, the number of first groove structures 102a is 3.

Exemplarily, prior to forming the first groove structure 102a in the second planarization layer 102, the second opening K is formed in the second inorganic protection layer 103. The second inorganic protection layer 103 is made of an inorganic material and the second planarization layer 102 is made of an organic material, and thus during the process of etching the second planarization layer 102 using a liquid for etching the organic material, the etching liquid does not etch the second inorganic protection layer 103. Therefore, upon forming the second opening K in the second inorganic protection layer 103, in the case that the second planarization layer 102 is etched through the second opening K, an over-etched process is performed on the second planarization layer 102 by the protection of the second inorganic protection layer 103, such that the first groove structure 102a communicated with the second opening K is formed in the second planarization layer 102, and the first groove structure 102a is ensured to be the teardrop-shaped groove structure. Subsequently, upon forming the cathode layer 203, a portion, inside the first groove structure 102a, of the cathode layer 203 is separated from a portion outside the first groove structure 102a.

Referring to FIG. 8, in some embodiments of the present disclosure, the second planarization layer 102 further includes a second groove structure 102b and a third groove structure 102c. The second groove structure 102b is closer to the display region 00b relative to the first groove structure 102a, the first groove structure 102a is closer to the display region 00b relative to the third groove structure 102c, and the second inorganic protection layer 103 covers side faces of the second groove structure 102b and the third groove structure 102c. In this way, by the second inorganic protection layer 103 covering the second groove structure 102b and the third groove structure 102c the second planarization layer 102 is isolated from the outside air, and the moisture and oxygen in the air are prevented from entering the light-emitting device 200 through the second planarization layer 102, such that the light-emitting layer in the light-emitting device 200 is avoided from being eroded by elements such as the moisture and oxygen in the air. Optionally, the second groove structure 102b and the third groove structure 102c are annular structures arranged along the winding region 00c.

In summary, some embodiments of the present disclosure provide a display panel. The display panel includes: the substrate, the plurality of light-emitting devices, the package layer, and the light-shielding layer. The light emitted at a large angle by the light-emitting device disposed in the display region close to the cutout region requires to pass through the package layer within the winding region between the display region and the cutout region prior to being emitted to the cutout region. Therefore, in the case that the light-shielding layer is deployed on the side, distal from the substrate, of the package layer and at least a portion of the light-shielding layer is ensured to be within the winding region, the light emitted at a large angle by the light-emitting device is shielded by the light-shielding layer prior to being emitted to the cutout region, such that the probability that light leakage occurs in the cutout region of the display panel is reduced. In this way, in a display device with the display panel, a photosensitive device disposed on a back side of the display panel is capable of sensing light normally, such that the photosensitive effect of the photosensitive device is improved.

Some embodiments of the present disclosure further provide a method for manufacturing a display panel to manufacture the display panel as illustrated in FIG. 3. The display panel includes a cutout region, a display region disposed on a periphery of the cutout region, and a winding region between the cutout region and the display region. The method includes the following steps.

In step A1, a substrate is provided.

In step A2, a plurality of light-emitting devices are formed on the substrate, wherein the plurality of light-emitting devices are within the display region.

In step A3, a package later and a light-shielding layer that are stacked are formed on the plurality of light-emitting devices, wherein the package layer is closer to the substrate relative to the light-shielding layer, and the light-shielding layer is provided with a first light-shielding portion within the winding region.

Optionally, in the case that the package layer and the light-shielding layer are formed, the cutout region on the display panel requires to be cut. Exemplarily, the laser cutting technique is employed to cut the display panel along an outer boundary of the cutout region of the display panel to remove a portion, within the cutout region, of the display panel.

It should be clearly understood by those skilled in the art that, for the convenience and conciseness of the descriptions, the working principles of the display panel described above may refer to the corresponding content in the embodiments of the structure of the display panel substrate, which is not repeated herein.

In summary, according to the method for manufacturing the display panel according to some embodiments of the present disclosure, light emitted at a large angle by the light-emitting device disposed in the display region close to the cutout region requires to pass through the package layer within the winding region between the display region and the cutout region prior to being emitted to the cutout region. Therefore, in the case that the light-shielding layer is deployed on the side, distal from the substrate, of the package layer and at least a portion of the light-shielding layer is ensured to be within the winding region, the light emitted at a large angle by the light-emitting device is shielded by the light-shielding layer prior to being emitted to the cutout region, such that the probability that light leakage occurs in the cutout region of the display panel is reduced. In this way, in a display device with the display panel, a photosensitive device disposed on a back side of the display panel is capable of sensing light normally, such that the photosensitive effect of the photosensitive device is improved.

Some embodiments of the present disclosure further provide a display device. The display device includes a photosensitive device and the display panel as described above. The photosensitive device is disposed on a side opposite to a display surface of the display panel, and an orthographic projection of a light-receiving surface of the photosensitive device on a substrate is within a cutout region.

The display device is a smartphone, a tablet computer, a television, a display, a notebook computer, a digital photo frame, a navigator, and any other product or component with a display function.

It should be noted that in the accompanying drawings, sizes of layers and regions may be exaggerated for clearer illustration. It should be understood that where an element or layer is referred to as being "on" another element or layer, the element or layer may be directly on another element, or intervening layers therebetween may be present. In addition, it should be understood that where an element or layer is referred to as being "under" another element or layer, the element or layer may be directly under the other element, or there may be more than one intervening layer or element. In addition, it may be further understood that in the case that a layer or element is referred to as being "between" two layers or two elements, the layer may be the only layer between the two layers or two elements, or more than one intervening layer or element may further be present. Like reference numerals indicate like elements throughout.

In the present disclosure, the terms "first" and "second" are only used for descriptive purposes, and cannot be understood as indicating or implying relative importance. The term "a plurality of" refers to two or more, unless expressly defined otherwise.

Described above are merely exemplary embodiments of the present disclosure, and are not intended to limit the present disclosure. Therefore, any modifications, equivalent substitutions, improvements, and the like made within the spirit and principles of the present disclosure shall be included in the protection scope of the present disclosure.

What is claimed is:

1. A display panel, comprising: a cutout region, a display region disposed on a periphery of the cutout region, and a winding region disposed between the cutout region and the display region;

wherein the display panel further comprises:

a substrate;

a plurality of light-emitting devices disposed on the substrate, wherein the plurality of light-emitting devices are within the display region; and a package layer and a light-shielding layer that are successively stacked and disposed on a side, distal from the substrate, of the plurality of light-emitting devices, wherein the package layer is closer to the substrate relative to the light-shielding layer, and at least a portion of the light-shielding layer is within the winding region; and wherein the substrate comprises: a base substrate and a plurality of pixel drive circuits disposed on the base substrate and electrically connected to the plurality of light-emitting devices in one-to-one correspondence; and the substrate further comprises first signal lines connected to the pixel drive circuits disposed in a same column and second signal lines electrically connected to the pixel drive circuits disposed in a same row; wherein a portion of the first signal lines comprise first windings, and a portion of the second signal lines comprise second windings, the first winding and the second winding being within the winding region.

2. The display panel according to claim 1, wherein the light-shielding layer comprises a first light-shielding portion within the winding region, an outer boundary of an orthographic projection of the first light-shielding portion on the substrate being consistent with an outer boundary of an orthographic projection of the winding region on the substrate.

3. The display panel according to claim 2, wherein the light-shielding layer further comprises a second light-shielding portion connected to the first light-shielding portion, wherein the second light-shielding portion is within the display region, an orthographic projection of the second light-shielding portion on the substrate being not at least partially overlapped with an orthographic projection of the light-emitting device on the substrate.

4. The display panel according to claim 3, wherein the second light-shielding portion comprises a plurality of via holes, wherein the plurality of via holes are in one-to-one correspondence to a portion of the plurality of light-emitting devices, an orthographic projection of one of the via holes on the substrate being at least partially overlapped with an orthographic projection of the corresponding light-emitting device on the substrate.

5. The display panel according to claim 4, wherein an outer boundary of the orthographic projection of one of the via holes on the substrate is at least partially overlapped with an outer boundary of the orthographic projection of the corresponding light-emitting device on the substrate.

6. The display panel according to claim 1, wherein an orthographic projection of the light-shielding layer on the substrate is annular-shaped, and an inner boundary of the orthographic projection of the light-shielding layer on the substrate is consistent with an outer boundary of an orthographic projection of the cutout region on the substrate.

7. The display panel according to claim 6, wherein a width of the orthographic projection of the light-shielding layer on the substrate is greater than or equal to 200 μm.

8. The display panel according to claim 1, wherein the package layer comprises an organic package layer, an orthographic projection of the organic package layer on the substrate being staggered from an orthographic projection of the winding region on the substrate;

wherein the display panel further comprises: a first planarization layer disposed between the package layer and the light-shielding layer, the first planarization layer covering a region where the organic package layer is staggered from the winding region.

9. The display panel according to claim 8, wherein the first planarization layer is completely within the winding region.

10. The display panel according to claim 9, further comprising: a first inorganic protection layer disposed between the first planarization layer and the light-shielding layer, wherein the first inorganic protection layer comprises a first opening, the first opening being within the winding region, and an outer boundary of an orthographic projection of the first opening on the substrate being not overlapped with an outer boundary of an orthographic projection of the cutout region on the substrate.

11. The display panel according to claim 1, wherein the light-emitting device comprises: an anode layer, a light-emitting layer, and a cathode layer that are successively stacked along a direction perpendicular to and away from the substrate, the anode layer being electrically connected to the pixel driver circuit; and the substrate further comprises: a second planarization layer and a second inorganic protection layer that are disposed on a side, distal from the base substrate, of the plurality of pixel drive circuits, wherein the second planarization layer is closer to the base substrate relative to the second inorganic protection layer;

wherein the second inorganic protection layer comprises a second opening, and the second planarization layer comprises a first groove structure communicated with the second opening, the first groove structure being configured to separate a portion, within the display region, of the cathode layer from a portion, within the winding region, of the cathode layer.

12. The display panel according to claim 1, wherein the second planarization layer further comprises a second groove structure and a third groove structure, wherein the second groove structure is closer to the display region relative to the first groove structure, and the first groove structure is closer to the display region relative to the third groove structure, the second inorganic protection layer covering side faces of the second groove structure and the third groove structure.

13. A method for manufacturing a display panel, wherein the display panel comprises a cutout region, a display region disposed on a periphery of the cutout region, and a winding region disposed between the cutout region and the display region, and the method comprises:

forming a plurality of light-emitting devices on a substrate, wherein the plurality of light-emitting devices are within the display region; and forming a package layer and a light-shielding layer, which are successively stacked, on the plurality of light-emitting devices, wherein the package later is closer to the substrate relative to the light-shielding layer, and the light-shielding layer comprises a first light-shielding portion within the winding region; and wherein the substrate comprises: a base substrate and a plurality of pixel drive circuits disposed on the base substrate and electrically connected to the plurality of light-emitting devices in one-to-one correspondence; and the substrate further comprises first signal lines connected to the pixel drive circuits disposed in a same column and second signal lines electrically connected to the pixel drive circuits disposed in a same row; wherein a portion of the first signal lines comprise first windings, and a portion of the second signal lines comprise second windings, the first winding and the second winding being within the winding region.

14. A display device, comprising: a photosensitive device and a display panel;

wherein the display panel comprises: a cutout region, a display region disposed on a periphery of the cutout region, and a winding region disposed between the cutout region and the display region;

wherein the display panel further comprises:

a substrate;

a plurality of light-emitting devices disposed on the substrate, wherein the plurality of light-emitting devices are within the display region; and a package layer and a light-shielding layer that are successively stacked and disposed on a side, distal from the substrate, of the plurality of light-emitting devices, wherein the package layer is closer to the substrate relative to the light-shielding layer, and at least a portion of the light-shielding layer is within the winding region;

wherein the photosensitive device is disposed on a side opposite to a display surface of the display panel, an orthographic projection of a light-receiving surface of the photosensitive device on the substrate being within the cutout region; and wherein the substrate comprises: a base substrate and a plurality of pixel drive circuits disposed on the base substrate and electrically connected to the plurality of light-emitting devices in one-to-one correspondence; and the substrate further comprises first signal lines connected to the pixel drive circuits disposed in a same column and second signal lines electrically connected to the pixel drive circuits disposed in a same row; wherein a portion of the first signal lines comprise first windings, and a portion of the second signal lines comprise second windings, the first winding and the second winding being within the winding region.

15. The display device according to claim 14, wherein the light-shielding layer comprises a first light-shielding portion within the winding region, an outer boundary of an orthographic projection of the first light-shielding portion on the substrate being consistent with an outer boundary of an orthographic projection of the winding region on the substrate.

16. The display device according to claim 15, wherein the light-shielding layer further comprises a second light-shielding portion connected to the first light-shielding portion, wherein the second light-shielding portion is within the display region, an orthographic projection of the second light-shielding portion on the substrate being not at least partially overlapped with an orthographic projection of the light-emitting device on the substrate.

17. The display device according to claim 16, wherein the second light-shielding portion comprises a plurality of via holes, wherein the plurality of via holes are in one-to-one correspondence to a portion of the plurality of light-emitting devices, an orthographic projection of one of the via holes on the substrate being at least partially overlapped with an orthographic projection of the corresponding light-emitting device on the substrate.

18. The display device according to claim 17, wherein an outer boundary of the orthographic projection of one of the via holes on the substrate is at least partially overlapped with an outer boundary of the orthographic projection of the corresponding light-emitting device on the substrate.

19. The display device according to claim 14, wherein an orthographic projection of the light-shielding layer on the substrate is annular-shaped, and an inner boundary of the orthographic projection of the light-shielding layer on the substrate is consistent with an outer boundary of an orthographic projection of the cutout region on the substrate.

* * * * *